US012687788B2

(12) United States Patent
Tsai

(10) Patent No.: US 12,687,788 B2
(45) Date of Patent: Jul. 21, 2026

(54) SYSTEM, SOFTWARE APPLICATION, AND METHOD FOR DOSE UNIFORMITY IMPROVEMENT

(71) Applicant: Applied Materials, Inc., Santa Clara, CA (US)

(72) Inventor: Chi-Ming Tsai, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 617 days.

(21) Appl. No.: 18/171,598

(22) Filed: Feb. 20, 2023

(65) Prior Publication Data

US 2024/0280913 A1 Aug. 22, 2024

(51) Int. Cl.
*G03F 7/00* (2006.01)

(52) U.S. Cl.
CPC ...... *G03F 7/70558* (2013.01); *G03F 7/70516* (2013.01); *G03F 7/70641* (2013.01)

(58) Field of Classification Search
CPC ............. G03F 7/70558; G03F 7/70516; G03F 7/70641
USPC ....................................... 430/5, 311; 355/67
See application file for complete search history.

(56) References Cited

U.S. PATENT DOCUMENTS

| | | | |
|---|---|---|---|
| 5,633,713 A | 5/1997 | Tanaka et al. | |
| 2017/0343903 A1 * | 11/2017 | Lee ..................... | G03F 7/70091 |
| 2022/0113635 A1 * | 4/2022 | Schepis ............... | G03F 7/70383 |

FOREIGN PATENT DOCUMENTS

| | | |
|---|---|---|
| CN | 102053504 A | 5/2011 |
| CN | 105359038 A | 2/2016 |
| JP | 6855565 B2 | 4/2021 |
| KR | 20170095358 A | 8/2017 |
| KR | 20190003814 A | 1/2019 |
| KR | 20200096843 A | 8/2020 |

OTHER PUBLICATIONS

PCT/US2024/012846, International Search Report and Written Opinion dated Jun. 4, 2024, 11 pages.
Brunner, Optimization of Optical Properties of Resist Processes, SPIE vol. 1466 Advances in Resist Technology and Processing VIII, 1991, 12 pages.

* cited by examiner

*Primary Examiner* — Caleen O Sullivan
(74) *Attorney, Agent, or Firm* — Patterson + Sheridan, LLP

(57) ABSTRACT

Embodiments of the present disclosure relate to methods, systems and apparatus for improving dose uniformity of the photolithography system. The method includes projecting a write beam from a projection unit toward a mask to form a plurality of incident lights, adjusting the projection unit to create a distribution of incidence angles corresponding to the incident lights, focusing the plurality of incident lights toward a photoresist layer disposed over a substrate with a lens, removing portions of the photoresist layer to form the device pattern, and forming structures on the substrate corresponding to the device pattern. The mask has a mask pattern corresponding to a device pattern. By focusing the plurality of incident lights towards the photoresist, a swing curve of the incident lights interfere to reduce a total swing curve of the incident lights to develop a photoresist layer with a photoresist pattern corresponding to the device pattern.

20 Claims, 7 Drawing Sheets

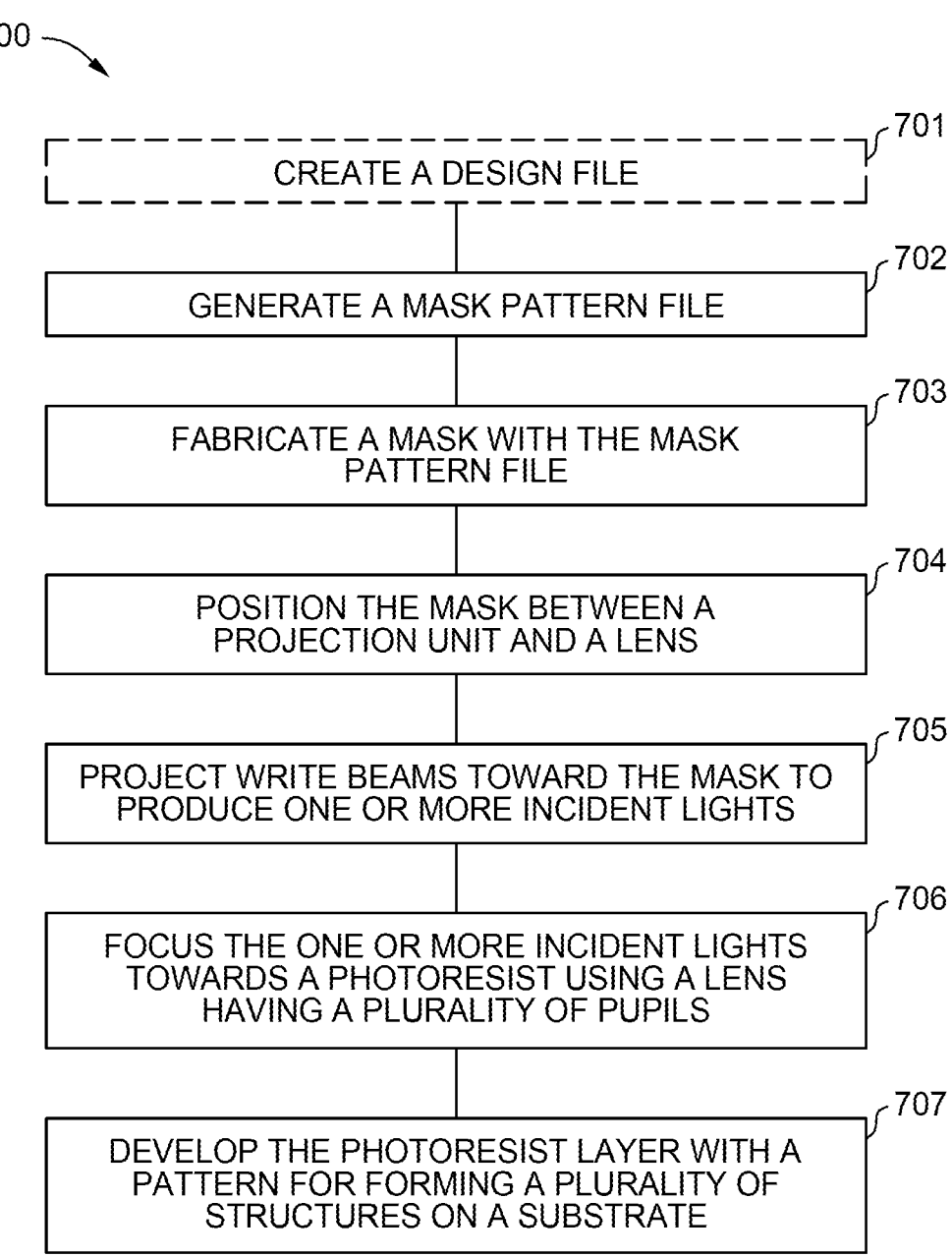

700

701
CREATE A DESIGN FILE

702
GENERATE A MASK PATTERN FILE

703
FABRICATE A MASK WITH THE MASK PATTERN FILE

704
POSITION THE MASK BETWEEN A PROJECTION UNIT AND A LENS

705
PROJECT WRITE BEAMS TOWARD THE MASK TO PRODUCE ONE OR MORE INCIDENT LIGHTS

706
FOCUS THE ONE OR MORE INCIDENT LIGHTS TOWARDS A PHOTORESIST USING A LENS HAVING A PLURALITY OF PUPILS

707
DEVELOP THE PHOTORESIST LAYER WITH A PATTERN FOR FORMING A PLURALITY OF STRUCTURES ON A SUBSTRATE

FIG. 7

SYSTEM, SOFTWARE APPLICATION, AND METHOD FOR DOSE UNIFORMITY IMPROVEMENT

BACKGROUND

Field

Embodiments of the present disclosure generally relate to photolithography systems. More specifically, embodiments of the present disclosure relate to a systems and methods for improving dose uniformity of the photolithography system.

Description of the Related Art

Photolithography is widely used in the manufacturing of semiconductor devices, such as for back-end processing of semiconductor devices, and display devices, such for liquid crystal displays (LCDs). For example, large area substrates are often used in the manufacture of display devices, such as optic chips used in augmented reality or virtual reality (AR/VR) devices. A photolithography system has a projection unit that projects write beams in the direction of one or more masks. The one or more masks have a pattern that corresponds to a pattern to be written into the photoresist layer on the surface of the substrate. However, variations in the thickness (e.g., thickness non-uniformity) in the photoresist layer affects the light absorption uniformity (e.g., swing effects) of the photoresist layer. The absorption uniformity of the photoresist affects the dose uniformity (e.g., light exposure) of a photolithography system, which affects the critical dimensions and electrical performance of the semiconductor device. Accordingly, there is a need in the art for improved methods for lithography to reduce absorption non-uniformity caused by a non-uniform photoresist layer.

SUMMARY

In one embodiment, a method is provided. The method includes projecting a write beam from a projection unit toward a mask to form a plurality of incident lights, adjusting the projection unit to create a distribution of incidence angles corresponding to the incident lights, focusing the plurality of incident lights toward a photoresist layer disposed over a substrate with a lens, removing portions of the photoresist layer to form the device pattern, and forming structures on the substrate corresponding to the device pattern. The mask has a mask pattern corresponding to a device pattern. By focusing the plurality of incident lights towards the photoresist, a swing curve of the incident lights interfere to reduce a total swing curve of the incident lights to develop a photoresist layer with a photoresist pattern corresponding to the device pattern.

In another embodiment, a lithography system is disclosed. The lithography system included a projection unit, a mask, and a lens. The projection unit is adjustable to change a distribution of incidence angles corresponding to one or more incident lights. The mask is positioned spaced apart from the projection unit in a projection direction. The mask has a mask pattern corresponding to a device pattern. The lens is spaced apart from the mask in the projection direction. The mask forms the one or more incident lights having a corresponding swing curve from a write beam projected from the projection unit. The one or more incident lights are focused by the lens to reduce a total swing curve of the incident lights to develop a photoresist layer on a substrate with a photoresist pattern corresponding to the device pattern.

In another embodiment, a controller storing instructions is disclosed. The instructions, when executed by a computer processor, cause the controller to perform operations of storing one or more mask patterns corresponding to one or more device patterns in a memory; writing a mask pattern of the one or more mask patterns into a mask corresponding to a device pattern of the one or more device patterns; projecting a write beam at the mask using a projection unit to create one or more incident lights; calculating an incidence angle for the an incident light of the one or more incident lights; adjusting a size and a shape of the projection unit to change an incidence angle of the incident light to reduce a total swing curve of a lithography system; focusing the one or more incident lights toward a photoresist layer disposed on a substrate using a lens; and generating a photoresist pattern on the photoresist layer corresponding to the mask pattern. The incidence angle is calculated using a thickness of the photoresist layer and a wavelength of the incident light.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 7 is a flow diagram of a method of a lithography process for reducing a swing effect in a photoresist layer, according to embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure relate to systems, methods, and apparatuses for improving dose uniformity of the photolithography system. Some embodiments of the method include projecting a write beam from a projection unit toward a mask to form a plurality of incident lights, adjusting the size and shape of the projection unit to create a distribution of incidence angles corresponding to the incident lights, focusing the plurality of incident lights toward a photoresist layer disposed over a substrate with a lens, removing portions of the photoresist layer to form the device pattern, and forming structures on the substrate corresponding to the device pattern. The mask has a mask pattern corresponding to a device pattern. By focusing the plurality of incident lights towards the photoresist, a swing curve of the incident lights interfere to reduce a total swing curve of the incident lights to develop a photoresist layer with a photoresist pattern corresponding to the device pattern. A controller stories instructions that, when executed by a computer processor, cause the controller to perform operations of the method using a lithography system.

Figures 1A, 1B:
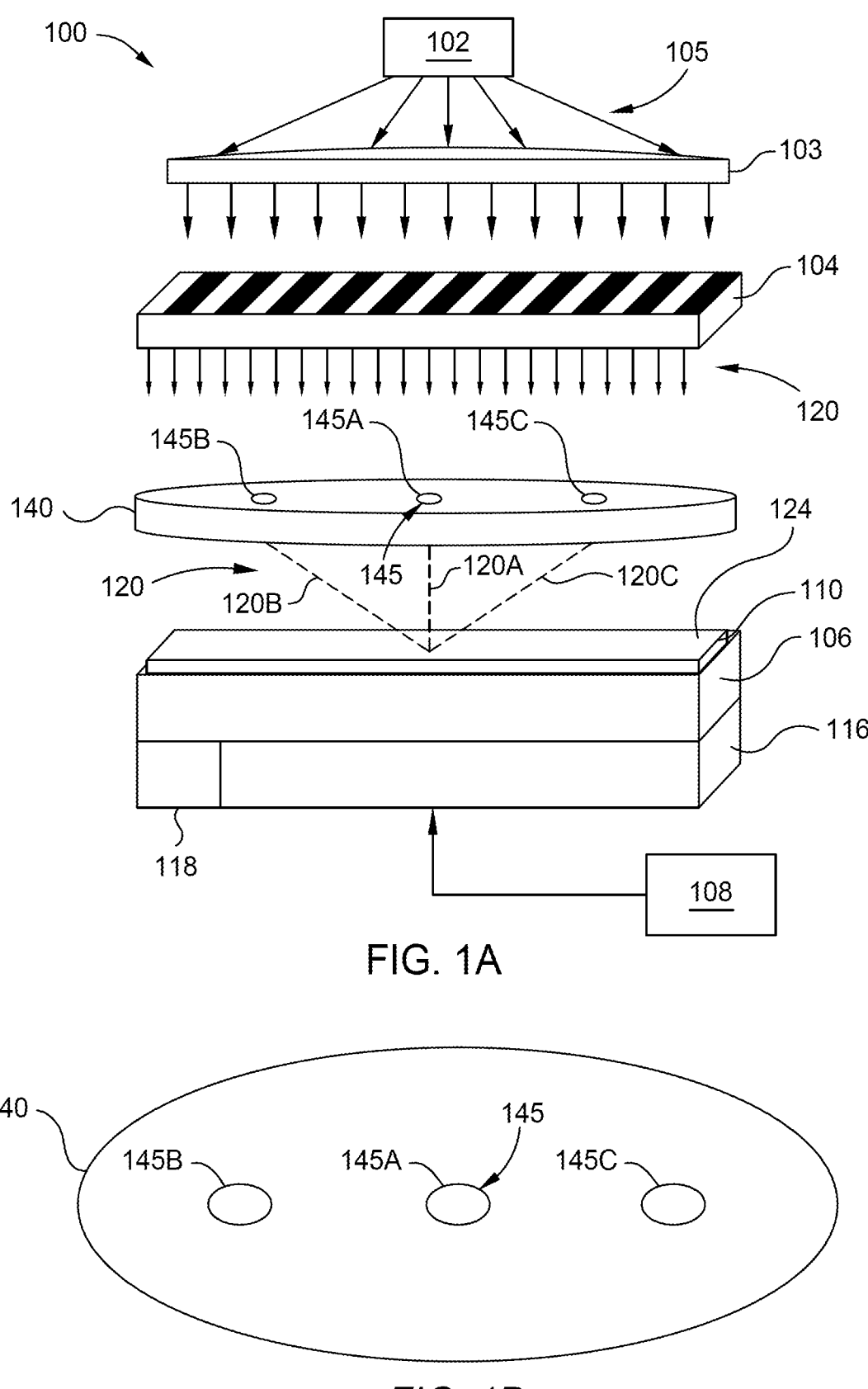
FIG. 1A is a schematic view of a lithography system according to an embodiment, according to embodiments.
FIG. 1B is a schematic top view of a lens, according to embodiments.

FIG. 1A is a schematic view of a lithography system 100. FIG. 1B is a schematic top plan view of a second lens 140. It is to be understood that the lithography system 100 is an exemplary system and other systems may be used with or modified to accomplish aspects of the present disclosure. The system includes a projection unit 102 that includes one or more light sources, such as light emitting diodes (LEDs) or lasers, capable of projecting write beams 105 in the direction of a mask 104. In some embodiments, a first lens 103 directs the write beams 105 towards the mask 104. The mask 104 is disposed over the substrate 106. The mask 104 has mask patterns that correspond to device patterns for forming structures on the substrate 106, and/or photoresist patterns for developing a photoresist layer 110 disposed over the substrate 106. A second lens 140 is positioned between the substrate 106 and the mask 104. In some embodiments, the second lens 140 includes any suitable material, for example, fused silica, calcium fluoride, or other suitable materials.

The substrate 106 includes any suitable material, for example, glass, which is used as part of a flat panel display. In some embodiments, which can be combined with other embodiments described herein, the substrate 106 is made of other materials capable of being used as a part of the flat panel display. In some embodiments, which can be combined with other embodiments described herein, the substrate 106 can have surface width of from about 300 mm to about 4000 mm, such as from about 500 mm to about 3000 mm, such as from about 1000 mm to about 2000 mm. In some embodiments, the substrate 106 is a rectangular substrate with dimensions of about 300×400 to about 3000× 3500, such as about 2940×3370.

In one embodiment, the substrate 106 has a film layer formed thereon to be patterned, such as by pattern etching thereof, and a photoresist layer 110 formed on the film layer to be patterned, which is sensitive to electromagnetic radiation, for example, ultraviolet (UV), extreme ultraviolet (EUV) or deep UV light. In another embodiment, the photoresist layer 110 is deposited on the substrate 106 and the photoresist layer 110 is developed to provide a pattern for deposition of structures onto the substrate 106. A positive tone photoresist includes portions of the photoresist layer 110 which, when exposed to radiation, are respectively soluble to a photoresist developer applied to the photoresist layer 110 after the pattern is written into the photoresist layer 110 using the electromagnetic radiation (e.g., light). A negative tone photoresist includes portions of the photoresist layer 110 which, when exposed to radiation, will be respectively insoluble to the photoresist developer applied to the photoresist layer 110 after the pattern is written into the photoresist layer 110 using the electromagnetic radiation (e.g., light). A negative tone development includes the positive tone photoresist layer 110 exposed by bright field mask, where the exposed region will be respectively insoluble in organic solvent (e.g. n-butanol) and remain on the substrate 106 post development. The chemical composition of the photoresist layer 110 determines whether the photoresist layer 110 is a positive photoresist or negative photoresist. The photoresist layer 110 has a thickness t from about 0.5 microns to about 2 microns. In some embodiments, the thickness of the photoresist layer 110 is about 1 to about 4 times the size of the structures to be formed on the substrate 106. However, other thicknesses are also contemplated.

During operation, the projection unit 102 projects write beams 105 (e.g., electromagnetic radiation or light) in a projection direction toward the mask 104 to develop the photoresist layer 110. In the illustrated embodiment, a first lens 103 focuses and directs the light from the projection unit 102 towards the mask 104. The mask patterns of the mask 104 corresponds to a device pattern to be written into the photoresist layer 110, when the write beams 105 are projected in the direction of the mask 104. In some embodiments, which can be combined with other embodiments described herein, the device pattern may correspond to a device to be patterned into the substrate 106. In other embodiments, which can be combined with other embodiments described herein, the device pattern may correspond to one or more devices to be patterned into the film layer disposed on the substrate 106. The mask 104 forms one or more incident lights 120 from the write beam 105. An image of the incident lights 120 corresponding to the mask pattern may be formed on the second lens 140. The image of the incident lights 120 is formed from a Fourier transform of the mask 104. The incident light 120 produces a first image 145A, a second image 145B, and a third image 145C. The second lens 140 focuses the electromagnetic radiation (e.g., light) from the one or more incident lights 120 toward the photoresist layer 110 to pattern the photoresist layer 110 with a photoresist pattern. For ease of illustration, the focusing of the incident light of the first image 145A is shown as first focused incident light 120A, the focusing of the incident light of the second image 145B is shown as second focused incident light 120B, and the focusing of the incident light of the third image 145C is shown as third focused incident light 120C. Nothing in this disclosure should be construed as limiting with regard to the way in which the incident light 120 is focused towards the photoresist layer 110. The photoresist pattern corresponds to the device pattern. The portions of the photoresist layer 110 that are exposed to the incident light 120 according to the mask pattern are removed in order to expose the substrate 106 or the thin film disposed on the substrate 106.

In some embodiments, which can be combined with other embodiments described herein, the lithography system 100 is sized to be capable of exposing the entire photoresist layer 110 on the substrate 106. In other embodiments, the lithography system 100 is sized to be capable of exposing a portion of the photoresist layer 110 on the substrate 106. The substrate 106 is supported by a stage 116 operable to position the substrate 106 in a predetermined path beneath one or more of the masks 104. The movement of the substrate 106 may be controlled by a controller 108. The controller 108 is generally designed to facilitate the control and automation of a lithography process based on a mask pattern file. The mask pattern file includes mask pattern data having instructions for the positioning of the mask 104 according to embodiments of the method 700 described herein. The controller 108 may be coupled to or in communication with at least the projection unit 102, the stage 116, and an encoder 118. The projection unit 102 and the encoder 118 may provide information to the controller 108 regarding the substrate processing and the substrate aligning. For example, the projection unit 102 may provide information to the controller 108 to alert the controller 108 that substrate processing has been completed.

Figure 2:
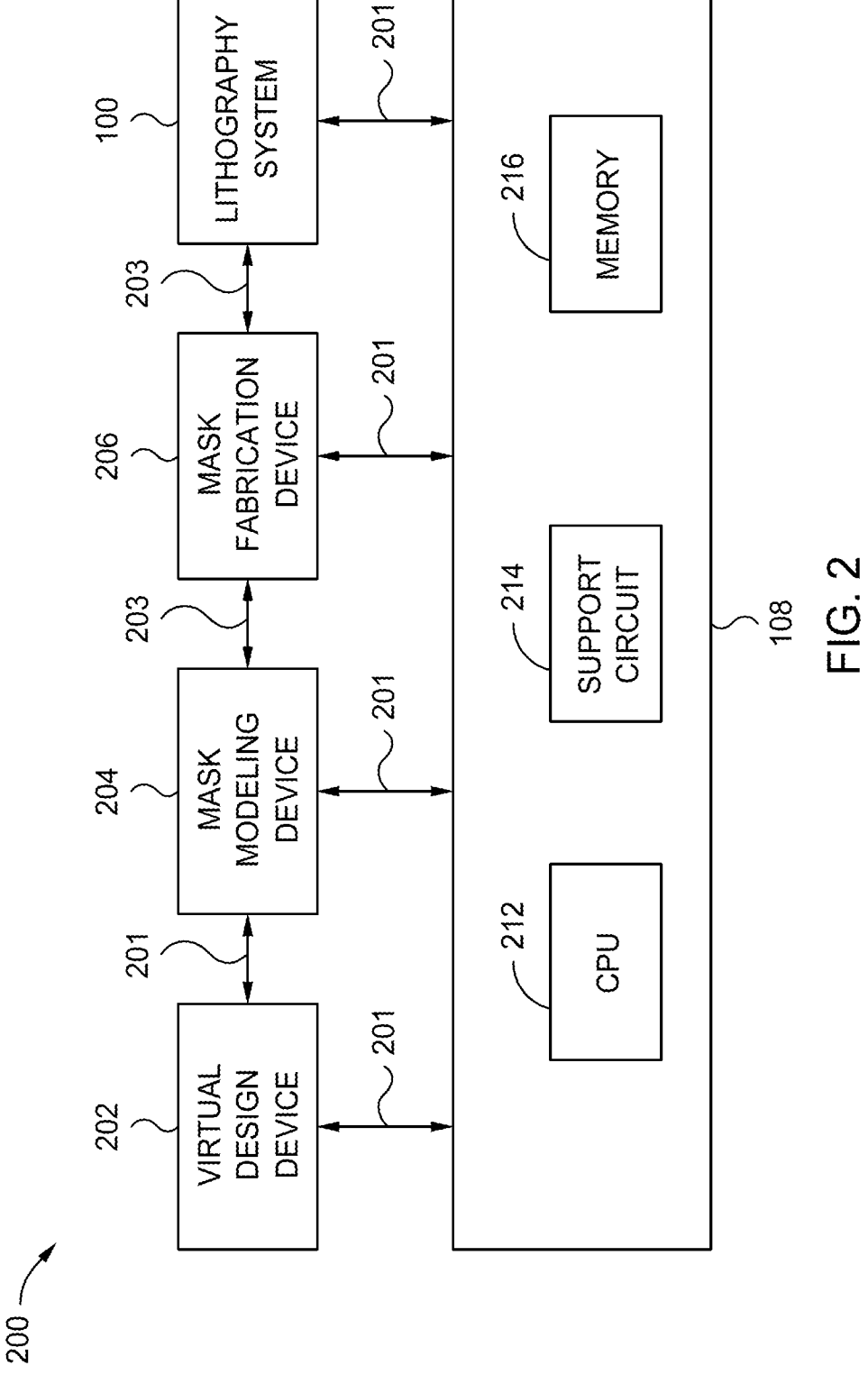
FIG. 2 is a schematic diagram of a lithography environment, according to embodiments.

FIG. 2 is a schematic diagram of a lithography environment 200. As shown in FIG. 2, the lithography environment 200 includes, but is not limited to, a virtual design device 202, a mask modeling device 204, a mask fabrication device 206, the lithography system 100, a controller 108, and a plurality of communication links 201, and a transfer system 203. Each of lithography environment devices is operable to be connected to the controller 108 by the communication links 201. Alternatively or additionally, each of the lithography environment devices can communicate indirectly by first communicating with the controller 108, followed by the controller communicating with the lithography environment device in question. Each of the lithography environment devices of the lithography environment 200 can be located in the same area or production facility, or the each of the lithography environment devices can be located in different areas.

The virtual design device 202 is operable to at least one of create, optimize, verify, and update a design file. The design file corresponds to a device pattern to be written into the photoresist layer 110. The mask modeling device 204 is operable to divide the design file and generate a mask pattern file. The mask fabrication device 206 is operable to receive to mask pattern data for the mask 104 transmitted from the mask modeling device 204. According to method 700 operations described herein, the mask fabrication device 206 is operable to fabricate the mask pattern of the mask 104 that corresponds to the device pattern to be written into a photoresist layer 110 when the mask 104 is positioned according to embodiments described herein. In one embodiment, the mask 104 may be a conventional mask. In other embodiments, the mask 104 may be a phase-shifting mask. In still other embodiments, the mask 104 may be a digital mask. The lithography system 100 is operable to receive the mask 104 according to method 700 operations described herein.

Each of the virtual design device 202, the mask modeling device 204, the mask fabrication device 206, the lithography system 100, and controller 108 include an on-board processor and memory, where the memory is configured to store instructions corresponding to any portion of the method 700 described below. The communication links 201 may include at least one of wired connections, wireless connections, satellite connections, and the like. The communications links 201 include sending and receiving a universal metrology file (UMF) or any other file used to store data, according to embodiments further described herein. The communications links 201 can include temporarily or permanently storing files or data in the cloud, before transferring or copying the files or data to a lithography system tool. The mask fabrication device 206 and the mask modeling device 204 are connected by the transfer system 203. The transfer system 203 is operable to transfer a substrate 106 between the mask fabrication device 206 and the lithography system 100. In one embodiment, which can be combined with other embodiments described herein, the transfer system 203 can include robots or other equipment connectable to the controller 108 operable to transfer the mask 104. In one embodiment, which can be combined with other embodiments described herein, the transfer system 203 is physically operable by the user.

The controller 108 includes a central processing unit (CPU) 212, support circuits 214 and memory 216. The CPU 212 can be one of any form of computer processor that can be used in an industrial setting for controlling the lithography environment devices. The memory 216 is coupled to the CPU 212. The memory 216 can be one or more of readily available memory, such as random access memory (RAM), read only memory (ROM), floppy disk, hard disk, or any other form of digital storage, local or remote. The support circuits 214 are coupled to the CPU 212 for supporting the processor in a conventional manner. These circuits include cache, power supplies, clock circuits, input/output circuitry, subsystems, and the like. The controller 108 can include the CPU 212 that is coupled to input/output (I/O) devices found in the support circuits 214 and the memory 216. For example, metrology devices may measure the thickness of the photoresist layer 110 and input the measurements to determine whether the photoresist layer 110 has been properly developed and patterned to the selected photoresist pattern.

The memory 216 can include one or more software applications, such as a controlling software program. The memory 216 can also include stored media data that is used by the CPU 212 to perform the method 700 described herein. The CPU 212 can be a hardware unit or combination of hardware units capable of executing software applications and processing data. The CPU 212 is generally configured to execute the one or more software applications and process the stored media data, which can be included within the memory 216. The controller 108 controls the transfer of data and files to and from the various lithography environment devices. The memory 216 is configured to store instructions corresponding to any operation of the method 700 according to embodiments described herein. For example, the memory may store recipes for developing the photoresist layer 110 and instructions for calculating changes to the recipes depending on the input from the metrology devices during the development of the photoresist layer 110.

Figure 3A:
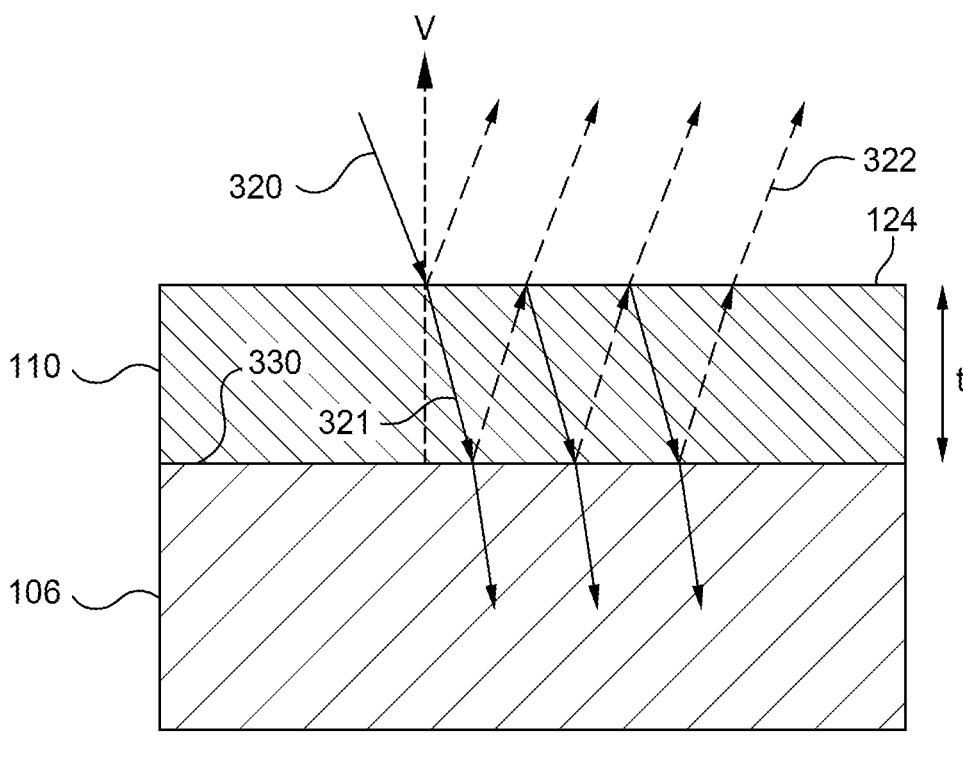
FIG. 3A shows the interaction between the photoresist layer and an incident light, according to embodiments.
Figure 3B:
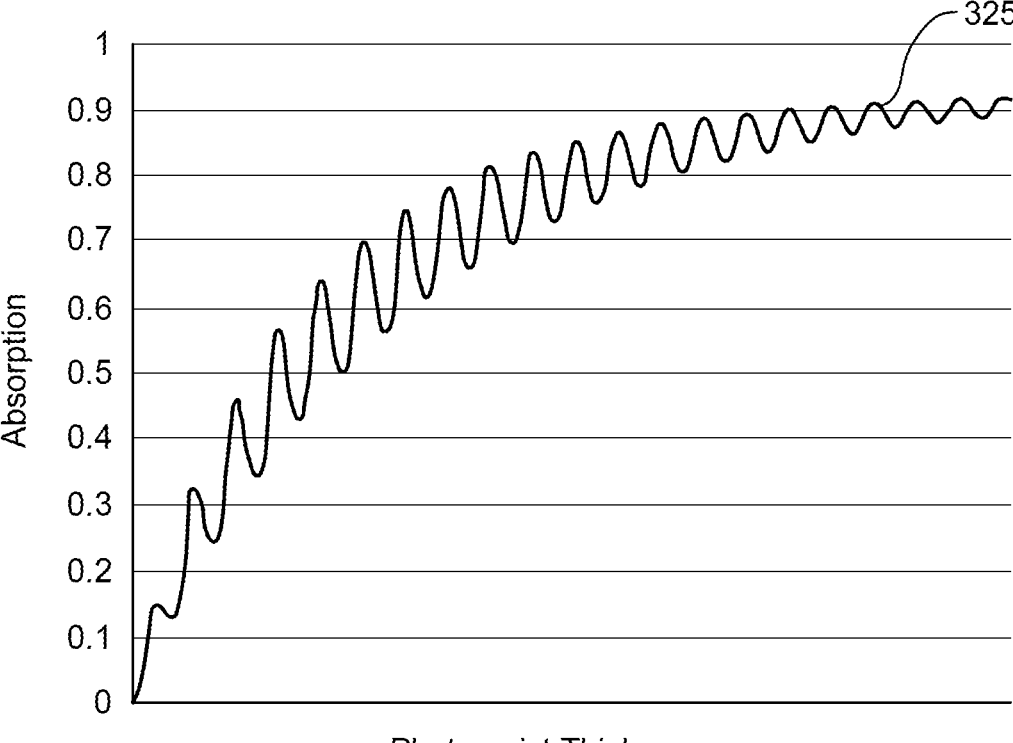
FIG. 3B shown a swing curve relationship between the thickness of the photoresist layer and photoresist absorption, according to embodiments.

FIG. 3A shows the interaction between the photoresist layer 110 and an incident light 320. FIG. 3B shows a swing curve 325 as defined by the relationship between the thickness t of the photoresist layer 110 and photoresist absorption. During development of the photoresist layer 110, as explained above, electromagnetic radiation (e.g., the incident light 320) is absorbed by the photoresist layer 110 to create a positive or a negative photoresist layer 110. The photoresist absorption is defined as the ratio of light absorbed by the photoresist layer 110 to the incident light 320. The incident light 320 that is not absorbed by the photoresist layer 110 is either transmitted into the layer below the photoresist layer 110 (e.g., the substrate 106 or some other material deposited on the substrate 106) as transmitted light 321 or reflected off the surface of the photoresist layer 110 as reflected light 322. Photoresist absorption depends on the thickness t of the photoresist layer 110 or other optical properties, such as opacity. The swing curve 325 is defined by the relationship curve between the photoresist absorption and the photoresist thickness t. The amplitude of the swing curve 325 is affected by the thickness t of the photoresist layer 110 (e.g., decreasing the thickness of the photoresist layer 110 increases the amplitude of the swing curve 325). The period of the swing curve (e.g., swing period) is related to the wavelength (λ) of the incident light 320. When the incident light 320 is normal to (e.g. perpendicular to) an uppermost surface 324 of the photoresist layer 110, the swing period is λ/2. When the incident light 320 is obliquely exposed to the uppermost surface 324 of the photoresist layer 110, the swing period becomes λ/2*cos(α), where α is the angle between the vector V normal to (e.g., perpendicular to) the uppermost surface 324 of the photoresist layer 110 and the vector of the transmitted light 321. The swing curve 325 is also affected by the refractive indexes of the photoresist layer 110 and the substrate 106, e.g., stronger reflection at a photoresist layer/substrate (PR/S) interface 330 will increase the amplitude of the swing curve 325.

The formation of the photoresist layer 110 may inherently include a variation in the thickness t (e.g., thickness non-uniformity) across the substrate 106. The thickness variation is a difference between a maximum point and a minimum point of the uppermost surface 124 of the photoresist layer 110. Photoresist deposition techniques can result in up to a 2-3% variation in the thickness of the photoresist layer 110 across the substrate 106, depending on the size of the substrate 106 and/or the deposition tool. A variation in thickness of 1% can affect the amount of light absorbed by the photoresist layer 110 by 10% to 20% during development of the photoresist layer 110. Absorption non-uniformity effects the definition of the photoresist layer development, thus effecting the critical dimensions (CDs) of the patterns defined by the photoresist layer 110. Poorly defined patterns create non-uniformity in the critical dimensions (CDs) of the structures being formed on the substrate 106, which can affect the electrical properties of the semiconductor device. Therefore, reducing the swing curve 325 of the photoresist layer 110 can increase the consistency of the CD for structures formed on the substrate 106 of the semiconductor device.

Figures 4A, 4B:
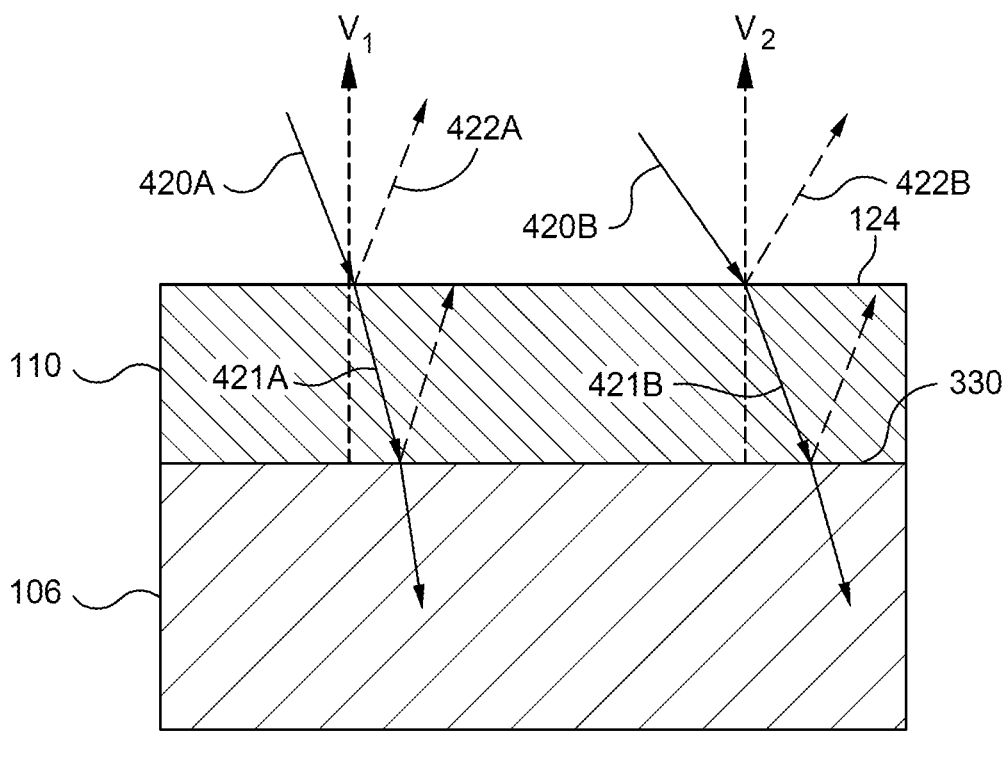
FIG. 4A shows the interaction between the photoresist layer and an incident light having two incoherent source points, according to embodiments.
FIG. 4B shows a swing curve relationship between the thickness of the photoresist layer and photoresist absorption for the incident light having two incoherent source points, according to embodiments.

FIG. 4A shows the interaction between the photoresist layer 110 and an incident light having two incoherent source points. FIG. 4B shows a first swing curve 425A and a second swing curve 425B as defined by the relationship between the thickness of the photoresist layer 110 and photoresist absorption for the incident light having two incoherent source points. In applications in which the projection unit 102 for developing the photoresist layer 110 has two incoherent source points (e.g., when using a mask), the write beam 105 becomes a first incident light 420A and a second incident light 420B. The first incident light 420A that is not absorbed by the photoresist layer 110 is either transmitted into the layer below the photoresist layer 110 (e.g., the substrate 106 or some other material deposited on the substrate 106) as transmitted light 421A or reflected off the surface of the photoresist layer 110 as reflected light 422A. The second incident light 420B that is not absorbed by the photoresist layer 110 is either transmitted into the layer below the photoresist layer 110 (e.g., the substrate 106 or some other material deposited on the substrate 106) as transmitted light 421B or reflected off the surface of the photoresist layer 110 as reflected light 422B. Each incident light 420A, 420B has its own swing curve 425A, 425B, respectively. The swing curves 425A, 425B interfere with each other either constructively or destructively, and can therefore effect the absorption non-uniformity, and thus the CD, of the resultant structures on the substrate 106 of the semiconductor device.

In one embodiment, the mask 104 is a conventional photomask. The mask 104 produces at least a 0-th order light, a +1st order light, and a −1st order light from the incident light 120. In other embodiments, +/−n-th order lights are also contemplated, where n is an integer greater than or equal to 0. The first image 145A, second image 145B, and third image 145C are images of the incident light 120 formed on the second lens 140 due to a Fourier transform of the mask 104. Due to the finite dimensions of the second lens 140, only the lower-order light can pass through the second lens 140 (e.g., 0th and +/−1st order light). The first focused incident light 120A illuminates the photoresist layer 110 at an angle normal to (e.g., perpendicular to) the uppermost surface 124 of the photoresist layer 110. The second focused incident light 120B and third focused incident light 120C are focused toward the photoresist layer 110 and illuminate the uppermost surface 324 of the photoresist layer 110 obliquely. Thus, the second focused incident light 120B and third focused incident light 120C have a smaller swing period than the first focused incident light 120A. An incidence angle α of the second focused incident light 120B and third focused incident light 120C depends on a pitch (P) of the line-space pattern and the optics of the mask 104. The period of the line-space pattern is determined by the device pattern. The lithography system 100 is optimized to minimize the period of the line-space pattern. Within each order of incident light (1, 2 . . . n−1, n), the incidence angles may also be different because the projection unit 102 has a non-zero radius (e.g., the size and shape of the projection unit 102 may affect the swing curve of the incident light). The incidence angle of an n-th order light within a photoresist layer 110 is calculated using Equation 1:

$$\sin \alpha = \frac{n \times \dfrac{\lambda}{n_{PR}}}{2P} \tag{1}$$

Where n is the order of light and $n_{PR}$ is the refractive index of the photoresist layer 110.

Figure 5:
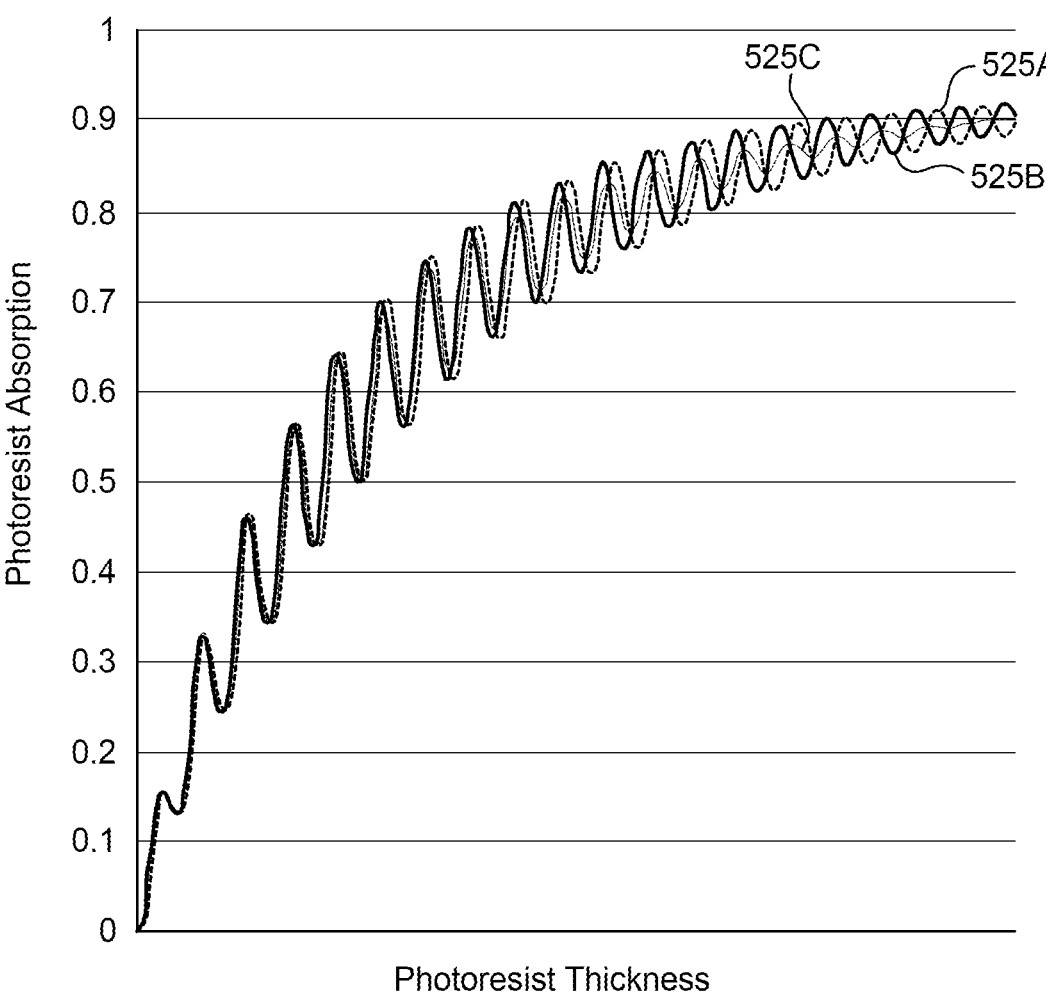
FIG. 5 is an average swing curve from 0-th order and 1st order incident lights, according to embodiments.

FIG. 5 is a total swing curve 525C from a 0-th order swing curve 525A and +/−1st order swing curve 525B. The first focused incident light 120A, the second focused incident light 120B, and the third focused incident light 120C illuminate the photoresist layer 110 simultaneously, creating a total swing curve with a smaller swing amplitude than the individual swing amplitudes. The period (T) of the swing curve is calculated using Equation 2:

$$T = \frac{\dfrac{1}{2} \times \dfrac{\lambda}{n_{PR}}}{\cos \alpha} \tag{2}$$

Based on the thickness t of the photoresist layer 110, the light goes through t/T number of cycles. The interference (I) between the 0-th order swing curve 525A (T) and the +/−1st order swing curve 525B (T') is measured using Equation 3:

$$\frac{t}{T} - \frac{t}{T'} = I \tag{3}$$

When the interference is an integer, the swing curves are constructively interfering. When the interference (I) is an integer+0.5, the swing curves are destructively interfering. When the swing curves destructively interfere, the total swing curve is reduced.

The total swing curve 525C can be reduced by controlling a shape and a size of the projection unit 102. By changing the size or the shape of the projection unit 102, the first image 145A, the second image 145B, and the third images 145C are formed to correspond to the size and the shape of the projection unit 102. The first image 145A, the second image 145B, and the third images 145C shapes and sizes create a distribution of incidence angles $\alpha$, which the second lens 140 focuses to the photoresist layer 110. The differences in the incidence angles $\alpha$ creates differences between the 0-th order swing curve 525A and the +/−1st order swing curve 525B. For example, a larger projection unit 102 broadens the +/−1st order swing curve, where the width of the +/−1st order swing curve corresponds to the size of the projection unit 102. A broader +/−1st order swing curve creates more destructive interference, thus reducing the total swing curve 525C. The size and shape of the projection unit 102, therefore, can be altered to achieve the incidence angles needed to reduce the total swing curve 525C, according to Equations 1-3.

Figure 6A:
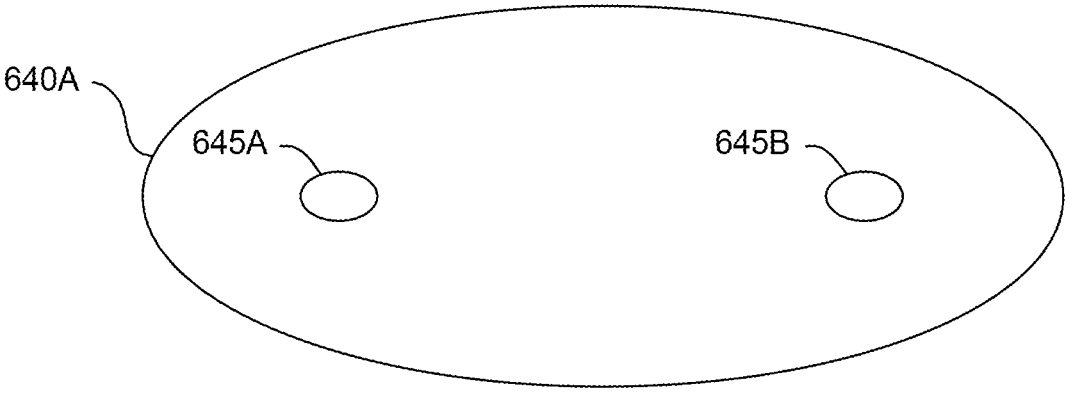
FIG. 6A is a schematic top plan view of a circular illumination phase shifting lens, according to embodiments.
Figure 6B:
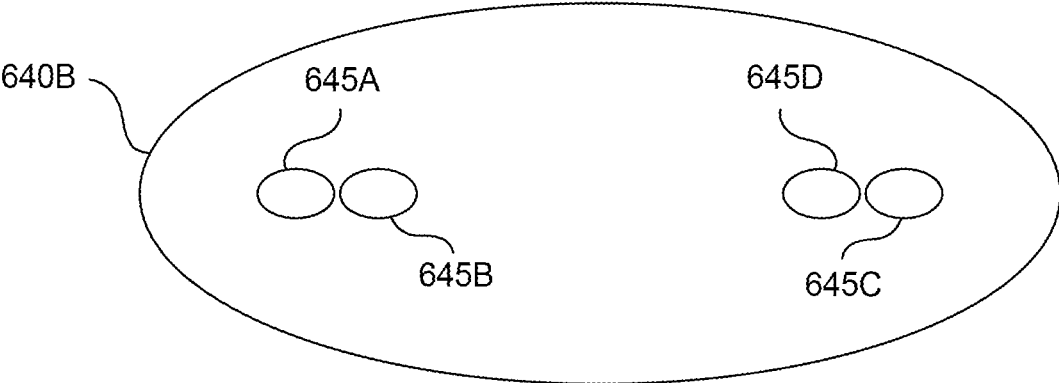
FIG. 6B is a schematic top plan view of a dipole illumination phase shifting lens, according to embodiments.

FIG. 6A is a schematic top plan view of a circular illumination phase shifting lens 640A. FIG. 6B is a schematic top plan view of a dipole illumination phase shifting lens 640B. The phase shifting lenses 640A, 640B are utilized with a phase shifting mask 104, which does not have a 0-th order incident light.

In one embodiment, the shape of the projection unit 102 is changed to a single circular projection unit 102. The circular projection unit 102 projects an incident light through the phase shifting mask 104. The phase shifting mask 104 forms has a first image 645A and a second image 645B on a circular illumination phase shifting lens 640A. The lens 640A focuses the +1st order incident light and the −1st order incident light toward the photoresist layer 110. By controlling the size and shape of the circular projection unit 102, a distribution of incident angles $\alpha$ is created and focused by the second lens 140. The distribution of incidence angles $\alpha$ creates differences between the +1st order swing curve and the −1st order swing curve, making the +1st order swing curve and the −1st order swing curve 180 degrees out of phase, reducing total swing curve 525C of the lithography system 100. In one embodiment, by widening the projection unit 102, the width of the swing curve from the +/−1st order incident light can be increased, thus more destructive interference and reducing the total swing curve 525C.

In some embodiments, based on the thickness of the photoresist layer 110 and the wavelength of the incident light, the controller 108 can calculate the shape and size of the projection unit 102 needed to create the distribution of incidence angles $\alpha$ necessary to reduce total swing curve 525 for the lithography system 100, according to Equations 1-3. The controller 108 can further use machine learning to optimize the algorithms for calculating the incidence angles based on the thickness of the photoresist layer 110 and to store instructions corresponding to incidence angles for photoresist layer development recipes to the memory 216. Further, the controller 108 may use metrology devices to monitor the development of the photoresist layer 110 to adjust the distribution of incidence angles $\alpha$ or wavelength of light to form the photoresist pattern.

In FIG. 6B, a dipole projection unit 102 is utilized and projects an incident light though the phase shifting mask 104. The dipole projection unit 102 has a first projection unit and a second projection unit. In one embodiment, the wavelength of the light from the first projection unit is the same as the wavelength of light from the second projection unit. In another embodiment, the wavelength of light from the first projection unit is different from the wavelength of light from the second projection unit. The dipole illumination phase shifting mask 104 forms a first image 645A, a second image 645B, a third image 645C, and a fourth image 645D on a dipole phase shifting lens 640B. The size and shape of the first projection unit and second projection unit control the incidence angles $\alpha$ of the +/−1st order incident light to create a distribution of incidence angels $\alpha$. The dipole phase shifting lens focuses the +/−1st order incident light of the first projection unit and the +/−1st order incident light of the second projection unit toward the photoresist layer 110. By controlling the size and shape of the first projection unit and second projection unit, the +1st order swing curves and the −1st order swing curves of the first projection unit and the second projection unit 180 degrees out of phase, reducing total swing curve 525C of the lithography system 100. In one embodiment, by widening the first projection unit and second projection unit, the width of the swing curve from the +/−1st order incident light can be increased to reduce the total swing curve 525C.

In some embodiments, based on the thickness of the photoresist layer 110 and the wavelength of the incident light, the controller 108 can calculate the shape and size of the first projection unit and second projection unit needed to create the distribution of incidence angles $\alpha$ necessary to the reduce total swing curve 525C for the lithography system 100. The controller 108 can further use machine learning to optimize the algorithms for calculating the incidence angles $\alpha$ based on the thickness of the photoresist layer 110 and to store instructions corresponding to incidence angles for photoresist layer development recipes to the memory 216. Further, the controller 108 may use metrology devices to monitor the development of the photoresist layer 110 to adjust the incidence angle $\alpha$ or wavelength of light to form the photoresist pattern.

In yet another embodiment, the mask 104 is a digital mask 104. The digital mask 104 includes a plurality of mirrors that can be programmed to turn "on" (e.g., make the mirror reflective) or "off" (e.g., make the mirror transparent/transmissive). The mirrors can control the transmission of light through the digital mask and toward the second lens 140, allowing for control of the transmission of the 0-th order and +/−1st order swing curves. The size and shape of the projection unit 102 may be modified to control the distribution of incidence angles $\alpha$ of the +/−1st order incident light. By controlling the incidence angles $\alpha$, the +/−1st order swing curves and the 0-th order swing curve of the projection unit 102 180 degrees out of phase.

In some embodiments, based on the thickness t of the photoresist layer 110 and the wavelength of the incident light, the controller 108 can calculate the shape and size of the projection unit 102 needed to create the distribution of incidence angles $\alpha$ necessary to reduce total swing curve for the lithography system 100. The controller 108 can further use machine learning to optimize the algorithms for calculating the incidence angles and mirror programs based on the thickness of the photoresist layer 110 and to store instructions corresponding to incidence angles for photoresist layer development recipes to the memory 216. Further, the controller 108 may use metrology devices to monitor the development of the photoresist layer 110 to adjust the indent angle or wavelength of light to for the photoresist pattern.

As a result of reducing the total swing curve of the lithography system 100, the dose uniformity and critical dimension variation is decreased about 5% to about 30%, such as about 10% to about 25%.

FIG. 7 is a flow diagram of a method 700 of a lithography process for reducing a swing effect in a photoresist layer 110. At optional operation 701, a design file is created by the virtual design device 202. The design file corresponds to the device pattern to be written into a photoresist layer 110. In some embodiments, which can be combined with other embodiments described herein, the design file is created prior to operations of the method 700 described herein. At operation 702, the mask modeling device 204 generates a mask pattern file having mask pattern data.

At operation 703, the mask fabrication device 206 fabricates the mask pattern of the mask 104 that correspond to the device pattern to be written into a photoresist layer 110 when the mask 104 is positioned according to embodiments described herein. The mask may be a conventional mask 104, a phase shifting mask, or a digital mask. At operation 704, the mask 104 are received by the lithography system 100 and positioned between a projection unit 102 and a second lens 140 according to the mask pattern data.

At operation 705, the projection unit 102 projects write beams 105 (e.g., electromagnetic radiation or light) toward the mask 104. In some embodiments, the write beams 105 pass through a first lens 103 in order to direct the write beams 105 towards the mask 104. The mask 104 produces at least one incident light 120, which produce images 145. The size and shape of the projection unit 102 can change an incident angle α of the at least one incident light 120. In one embodiment, changing the size of the projection unit creates a distribution of incident angles α. In one embodiment, the mask 104 is a conventional mask that produces a first image 145A, a second image, and a third image 145C on a second lens 140. In another embodiment, the mask 104 is a phase shifting mask that produces a +1st order image and a −1st order image.

that is normal to an uppermost surface 124 of the substrate 106, a second image 145B that contacts the uppermost surface 124 of the substrate 106 obliquely, and a third focused incident light 120C that contacts the uppermost surface 124 of the substrate 106 obliquely. that contacts the uppermost surface 124 of the substrate 106 obliquely, and a −1st order incident light that contacts the uppermost surface 124 of the substrate 106 obliquely.

At operation 706, the second lens 140 focuses the incident light 120 toward the photoresist layer 110. In the embodiment in which a conventional mask 104 is utilized, the second lens 140 focuses the incident light from the first image 145A, the second image 145B, and the third image 145C toward the photoresist layer 110. For ease of illustration, the focusing of the incident light of the first image 145A is shown as first focused incident light 120A, the focusing of the incident light of the second image 145B is shown as second focused incident light 120B, and the focusing of the incident light of the third image 145C is shown as third focused incident light 120C. Nothing in this disclosure should be construed as limiting with regard to the way in which the incident light 120 is focused towards the photoresist layer 110. The first focused incident light 120A may correspond to a 0-th order incident light and the second focused incident light 120B and third focused incident light 120C may correspond to the +/−1st order incident lights toward the photoresist layer 110.

Based on the size and shape of the projection unit, the distribution of incidence angles of the incident light 120 make the swing curve of a +1st order incident light and a swing curve of the −1st order incident light 180 degrees out of phase with a swing curve of the 0-th order incident light in order to reduce a total swing curve of the lithography system 100. In the embodiment in which a phase shifting mask 104 is utilized, the second lens 140 focuses the +/−1st order incident lights toward the photoresist. Based on the size and shape of the projection unit, the distribution of incidence angles of the incident light makes a swing curve of the +1st order incident light and a swing curve of the −1st order incident light 180 degrees out of phase with each other in order to reduce a total swing curve of the lithography system 100. In the embodiment with the digital mask, a plurality of programmable mirrors can control the transmission of light through the digital mask and toward the second lens 140, allowing for the second lens 140 to control the 0-th order and +/−1st order swing curves. Based on the size and shape of the projection unit, the distribution of incidence angles of the incident light make the swing curve of a +1st order incident light and a swing curve of the −1st order incident light 180 degrees out of phase with a swing curve of the 0-th order incident light in order to reduce a total swing curve of the lithography system 100. In one embodiment, the method includes programming the programmable mirrors to be one of transparent or reflective in order to control the transmission of light through the digital mask.

At operation 707, the focused incident light develops the photoresist layer 110 with a pattern for forming a plurality of structures on the substrate 106. After the incident light 120 develops the photoresist layer 110, portions of the photoresist layer 110 are dissolved to form a pattern. In one embodiment, the pattern exposes a film layer disposed on the substrate 106, which can be etched to form the structures on the substrate 106. In another embodiment, the pattern exposes the substrate 106 to allow for deposition of structures on the substrate 106.

A controller 108, including a central processing unit (CPU) 212, support circuits 214 and memory 216, may be coupled to or in communication with at least the projection unit 102, the stage 116, and an encoder 118. The projection unit 102 and the encoder 118 may provide information to the controller 108 regarding the substrate processing and the incidence angles. For example, the projection unit 102 may provide information to the controller 108 to alert the controller 108 that substrate processing has been completed or that the incidence angles are not aligned with a photoresist layer development recipe. In some embodiments, the size and shape of the projection unit 102 may be controlled by a controller 108 to control the incidence angle α of the +/−1st order incident light. Based on the thickness of the photoresist layer 110 and the wavelength of the incident light, the controller 108 can calculate size and shape of the projection unit 102 needed to create the distribution of incidence angles α necessary to reduce total swing curve for the lithography system 100. The controller 108 can further use machine learning to optimize the algorithms for calculating the incidence angles based on the thickness of the photoresist layer 110 and to store instructions corresponding to incidence angles for photoresist layer development recipes to the memory 216. Further, the controller 108 may use metrology devices to monitor the development of the photoresist layer 110 to adjust the incidence angle or wavelength of light to form the photoresist pattern.

In summation, a method and system of a lithography process that provides improved methods for lithography to reduce absorption non-uniformity caused by a non-uniform photoresist layer is disclosed. The system projects write beams from a projection unit towards a mask to form a plurality of incident lights. The incident lights form an image of a pattern from the mask on a lens, which focuses the incident lights toward a non-uniform photoresist. By measuring the thickness of the photoresist layer and controlling the size and shape of the projection unit, the incidence angle necessary to reduce a total swing curve of the system can be achieved. Reducing the total swing curve can reduce the absorption non-uniformity of light into the photoresist layer. Absorption non-uniformity effects the definition of the photoresist layer development, thus effecting the critical dimensions (CDs) of the resultant optical device. A controller can optimize the size and shape of the projection unit using machine learning. The controller can monitor the development of the photoresist layer during lithography in order to adjust the size and shape of the projection unit to optimize the lithography.

While the foregoing is directed to embodiments of the present disclosure, other and further embodiments of the disclosure may be devised without departing from the basic scope thereof, and the scope thereof is determined by the claims that follow.

The invention claimed is:

1. A lithography system, comprising:
a projection unit, wherein a size of the projection unit is adjustable to change a distribution of incidence angles corresponding to one or more incident lights;
a mask positioned spaced apart from the projection unit in a projection direction and having a mask pattern corresponding to a device pattern; and
a lens spaced apart from the mask in the projection direction; and
wherein the mask forms the one or more incident lights having a corresponding swing curve from a write beam projected from the projection unit, and wherein the one or more incident lights are focused by the lens to reduce a total swing curve of the incident lights to develop a photoresist layer on a substrate with a photoresist pattern corresponding to the device pattern.

2. The lithography system of claim 1, wherein the lens focuses a first incident light, a second incident light, and a third incident light.

3. The lithography system of claim 1, wherein the mask is a phase shifting mask and wherein the lens focuses a first incident light and a second incident light.

4. The lithography system of claim 1, wherein the projection unit is a dipole projection unit including a first projection unit and a second projection unit, the mask is a phase shifting mask, and wherein the lens focuses a first incident light of the first projection unit, a second incident light of the second projection unit, a third incident light of the first projection unit, and a fourth incident light of the second projection unit to reduce a total swing curve of the incident lights.

5. The lithography system of claim 1, wherein the mask is a digital mask having a plurality of mirrors programmed to turn on and off to control a transmission light through the digital mask and wherein the lens focuses a first incident light, a second incident light, and a third incident light to reduce a total swing curve of the incident lights.

6. The lithography system of claim 1, wherein the one or more incident lights each have a swing curve corresponding to a thickness of the photoresist layer, an incidence angle of exposure of the incident lights to the photoresist layer, and a wavelength of the incident lights.

7. A lithography system, comprising:
a circular projection unit, wherein a size of the circular projection unit is adjustable to change a distribution of incidence angles corresponding to one or more incident lights;
a phase shifting mask positioned spaced apart from the circular projection unit in a projection direction and having a mask pattern corresponding to a device pattern; and
a circular illumination phase shifting lens spaced apart from the phase shifting mask in the projection direction; and
wherein the phase shifting mask forms the one or more incident lights having a corresponding swing curve from a write beam projected from the circular projection unit, and wherein the one or more incident lights are focused by the circular illumination phase shifting lens to reduce a total swing curve of the incident lights to develop a photoresist layer on a substrate with a photoresist pattern corresponding to the device pattern.

8. The lithography system of claim 7, further comprising a first lens disposed between the circular projection unit and the phase shifting mask.

9. The lithography system of claim 7, wherein the substrate is supported by a stage configured to position the substrate in a predetermined path beneath the phase shifting mask.

10. The lithography system of claim 9, further comprising a controller in communication with the circular projection unit and configured to control a movement of the substrate via the stage.

11. The lithography system of claim 10, further comprising an encoder, wherein the encoder and the circular projection unit are configured to provide information to the controller regarding substrate processing and alignment.

12. The lithography system of claim 7, wherein the lens focuses a first incident light, a second incident light, and a third incident light.

13. The lithography system of claim 7, wherein the one or more incident lights each have a swing curve corresponding to a thickness of the photoresist layer, an incidence angle of exposure of the incident lights to the photoresist layer, and a wavelength of the incident lights.

14. A lithography system, comprising:
a dipole projection unit, wherein the size of the dipole projection unit is adjustable to change a distribution of incidence angles corresponding to one or more incident lights;
a dipole illumination phase shifting mask positioned spaced apart from the dipole projection unit in a projection direction and having a mask pattern corresponding to a device pattern; and
a dipole phase shifting lens spaced apart from the dipole illumination phase shifting mask in the projection direction; and
wherein the dipole illumination phase shifting mask forms the one or more incident lights having a corresponding swing curve from a write beam projected from the dipole projection unit, and wherein the one or more incident lights are focused by the dipole phase shifting lens to reduce a total swing curve of the incident lights to develop a photoresist layer on a substrate with a photoresist pattern corresponding to the device pattern.

15. The lithography system of claim 14, further comprising a first lens disposed between the dipole projection unit and the dipole illumination phase shifting mask.

16. The lithography system of claim 14, wherein the substrate is supported by a stage configured to position the substrate in a predetermined path beneath the dipole illumination phase shifting mask.

17. The lithography system of claim 16, further comprising a controller in communication with the dipole projection unit and configured to control a movement of the substrate via the stage.

18. The lithography system of claim 17, further comprising an encoder, wherein the encoder and the dipole projection unit are configured to provide information to the controller regarding substrate processing and alignment.

19. The lithography system of claim 14, wherein the lens focuses a first incident light, a second incident light, and a third incident light.

20. The lithography system of claim 14, wherein the one or more incident lights each have a swing curve corresponding to a thickness of the photoresist layer, an incidence angle of exposure of the incident lights to the photoresist layer, and a wavelength of the incident lights.

* * * * *